United States Patent
Wang et al.

(10) Patent No.: US 6,486,682 B1
(45) Date of Patent: Nov. 26, 2002

(54) DETERMINATION OF DIELECTRIC CONSTANTS OF THIN DIELECTRIC MATERIALS IN A MOS (METAL OXIDE SEMICONDUCTOR) STACK

(75) Inventors: Zhigang Wang, San Jose, CA (US); Nian Yang, San Jose, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/904,736

(22) Filed: Jul. 13, 2001

Related U.S. Application Data

(60) Provisional application No. 60/291,860, filed on May 18, 2001.

(51) Int. Cl.$^7$ ................................................ H01L 23/58
(52) U.S. Cl. ........................ 324/671; 324/769; 324/765; 438/591; 438/216; 438/261; 438/287; 438/782
(58) Field of Search ................................. 438/591, 592, 438/593, 594, 585, 778, 782, 216, 261, 263, 264, 287; 324/671, 662, 765, 769; 427/66

(56) References Cited

U.S. PATENT DOCUMENTS 5,756,147 A * 5/1998 Wu et al. ................. 427/126.2
6,232,235 B1 * 5/2001 Cave et al. ................. 438/623

* cited by examiner

*Primary Examiner*—Christine K. Oda
*Assistant Examiner*—Vincent Q. Nguyen
(74) *Attorney, Agent, or Firm*—Monica H. Choi

(57) ABSTRACT

First and second dielectric constants, $e_1$ and $e_2$ respectively, for first and second dielectric materials forming a MOS (metal oxide semiconductor) stack are determined. First and second test MOS stacks having first and second total effective oxide thickness, $EOT_A$ and $EOT_B$, respectively, are formed. The first and second test MOS stacks include first and second interfacial structures comprised of the second dielectric material with first and second thickness, $T_{2A}$ and $T_{1A}$, respectively. In addition, the first and second test MOS stacks include first and second high-K structures comprised of the first dielectric material with first and second thickness, $T_{2B}$ and $T_{1B}$, respectively. The thickness parameters $EOT_A$, $T_{1A}$, $T_{2A}$, $EOT_B$, $T_{1B}$, and $T_{2B}$ of the test MOS stacks are measured. The dielectric constants, $e_1$ and $e_2$, are then determined depending on relations between values of $EOT_A$, $T_{1A}$, and $T_{2A}$, and between values of $EOT_B$, $T_{1B}$, and $T_{2B}$.

24 Claims, 3 Drawing Sheets

DETERMINATION OF DIELECTRIC CONSTANTS OF THIN DIELECTRIC MATERIALS IN A MOS (METAL OXIDE SEMICONDUCTOR) STACK

This patent application claims priority from the provisional patent application with Ser. No. 60/291,860 filed on May 18, 2001 and with the same title and inventorship herewith. The provisional patent application with Ser. No. 60/291,860 is in its entirety incorporated herewith by reference.

BACKGROUND OF THE INVENTION

1. Field of the Invention

The present invention relates generally to MOS (metal oxide semiconductor) devices, and more particularly, to a mechanism for determining the respective dielectric constant of each of the dielectric materials forming a MOS (metal oxide semiconductor) stack.

2. Discussion of the Related Art

Referring to FIG. 1, in a metal oxide semiconductor (MOS) stack 100, a conductive structure 102 comprised of a metal (or other types of conductive material such as polysilicon for example) is formed on a high-K structure 104 comprised of a dielectric material having a dielectric constant higher than that of silicon dioxide ($SiO_2$). An interfacial structure 106 is disposed between the high-K structure 104 and the semiconductor substrate 103 to provide a smooth structural transition from the high-K structure 104 to the semiconductor substrate 103.

For example, the conductive structure 102 is comprised of aluminum, the high-K structure 104 is comprised of a metal oxide, the semiconductor substrate 103 is comprised of silicon, and the interfacial structure 106 is comprised of silicon dioxide ($SiO_2$). The high-K structure 104 comprised of a dielectric material having a dielectric constant higher than that of silicon dioxide ($SiO_2$) is used as MOS device dimensions are further scaled down including the thickness of the dielectric materials between the conductive structure 102 and the semiconductor substrate 103. For a given capacitance, a dielectric material with a higher dielectric constant has a higher thickness.

When the high-K structure 104 comprised of a dielectric material having a dielectric constant higher than that of silicon dioxide ($SiO_2$) is used, a higher thickness of the dielectric materials (including the high-K structure 104 and the interfacial structure 106) between the conductive structure 102 and the semiconductor substrate 103 is used than if simply silicon dioxide ($SiO_2$) alone were to be used. A higher thickness of the dielectric materials between the conductive structure 102 and the semiconductor substrate 103 is advantageous for minimizing tunneling current through such dielectric materials. As MOS device dimensions are scaled down such that the thickness of the dielectric materials between the conductive structure 102 and the semiconductor substrate 103 is in a range of tens of angstroms, tunneling current may be a significant source of undesired leakage current for the MOS device.

With formation of the dielectric stack including the interfacial structure 106 typically comprised of silicon dioxide ($SiO_2$) and the high-K structure 104, determination of the effective dielectric constant of the high-K structure 104 and of the interfacial structure 106 is desired. When the thicknesses of the high-K structure 104 and the interfacial structure 106 are scaled down to tens of angstroms, the effective dielectric constants for the dielectric materials of the high-K structure 104 and the interfacial structure 106 may deviate significantly from the dielectric constant of such dielectric materials in bulk.

SUMMARY OF THE INVENTION

Accordingly, in a general aspect of the present invention, the dielectric constants of the interfacial structure and the high-K structure forming a MOS (metal oxide semiconductor) stack are determined by forming test MOS (metal oxide semiconductor) stacks.

In a general aspect of the present invention, in a system and method for determining a first dielectric constant, $e_1$, for a first dielectric material and a second dielectric constant, $e_2$, for a second dielectric material forming a MOS (metal oxide semiconductor) stack, a first test MOS (metal oxide semiconductor) stack and a second test MOS (metal oxide semiconductor) stack are formed. The first test MOS stack has a first total effective oxide thickness, $EOT_A$. The first test MOS stack includes a first interfacial structure comprised of the second dielectric material having the second dielectric constant, $e_2$, and having a first interfacial thickness $T_{2A}$. The first test MOS stack also includes a first high-K structure comprised of the first dielectric material having the first dielectric constant, $e_1$, and having a first high-K thickness, $T_{1A}$. The first interfacial structure is disposed on a semiconductor substrate, and the first high-K structure is disposed between the first interfacial structure and a first conductive structure.

Similarly, the second test MOS stack has a second total effective oxide thickness, $EOT_B$. The second test MOS stack includes a second interfacial structure comprised of the second dielectric material having the second dielectric constant, $e_2$, and having a second interfacial thickness $T_{2B}$. The second test MOS stack also includes a second high-K structure comprised of the first dielectric material having the first dielectric constant, $e_1$, and having a second high-K thickness $T_{1B}$. The second interfacial structure is disposed on the semiconductor substrate, and the second high-K structure is disposed between the second interfacial structure and a second conductive structure.

After formation of the first and second test MOS stacks, the first total effective oxide thickness, $EOT_A$, of the first test MOS stack and the second total effective oxide thickness, $EOT_B$, of the second test MOS stack are measured. In addition, the first interfacial thickness, $T_{2A}$, of the first interfacial structure and the first high-K thickness, $T_{1A}$, of the first high-K structure are measured. Also, the second interfacial thickness, $T_{2B}$, of the second interfacial structure and the second high-K thickness, $T_{1B}$, of the second high-K structure are measured. The first dielectric constant, $e_1$, and the second dielectric constant, $e_2$, are then determined depending on relations between values of $EOT_A$, $T_{1A}$, and $T_{2A}$, and between values of $EOT_B$, $T_{1B}$, and $T_{2B}$.

For example, the relations between values of $EOT_A$, $T_{1A}$, and $T_{2A}$ and between values of $EOT_B$, $T_{1B}$, and $T_{2B}$ are as follows:

$$EOT_A = T_{1A}*(e_{ox}/e_1) + T_{2A}*(e_{ox}/e_2)$$

$$EOT_B = T_{1B}*(e_{ox}/e_1) + T_{2B}*(e_{ox}/e_2),$$

with $e_{ox}$ being the dielectric constant of silicon dioxide ($SiO_2$).

The present invention may be used to particular advantage when the first total effective oxide thickness, $EOT_A$, of the first test MOS stack and the second total effective oxide thickness, $EOT_B$, of the second test MOS stack are measured using a capacitance and voltage measurement system or a current and voltage measurement system. In addition, the first interfacial thickness, $T_{2A}$, of the first interfacial structure and the first high-K thickness, $T_{1A}$, of the first high-K structure are measured using a HRTEM (high resolution transmission electron microscopy) system, according to one embodiment of the present invention. Similarly, the second interfacial thickness, $T_{2B}$, of the second interfacial structure and the second high-K thickness, $T_{1B}$, of the second high-K structure are measured using a HRTEM (high resolution transmission electron microscopy) system, according to one embodiment of the present invention.

In this manner, the interfacial structures and the high-K structures of the first and second test MOS stacks are formed to be comprised of the first and second dielectric materials. The first dielectric constant, $e_1$, for the first dielectric material and the second dielectric constant, $e_2$, for the second dielectric material are determined from measuring the thickness parameters $EOT_A$, $T_{1A}$, $T_{2A}$, $EOT_B$, $T_{1B}$, and $T_{2B}$ of the first and second test MOS stacks. Thus, the first dielectric constant, $e_1$, for the first dielectric material and the second dielectric constant, $e_2$, for the second dielectric material are effectively determined even when the interfacial structure and the high-K structure of a MOS stack are formed to be relatively thin in the range of tens of angstroms.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

Figure 1:
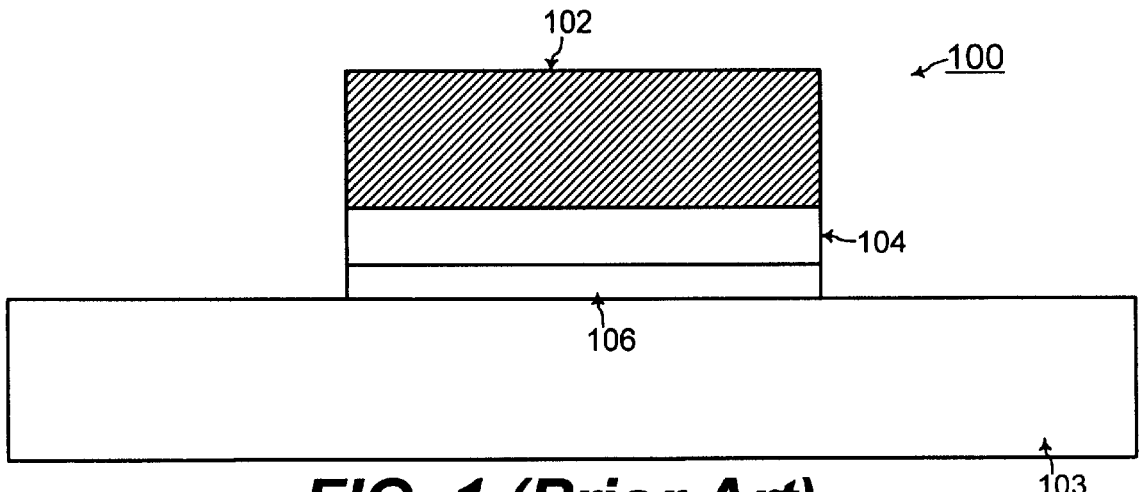
FIG. 1 shows a cross-sectional view of a MOS (metal oxide semiconductor) stack including an interfacial structure and a high-K structure formed on a semiconductor substrate.
Figure 2:
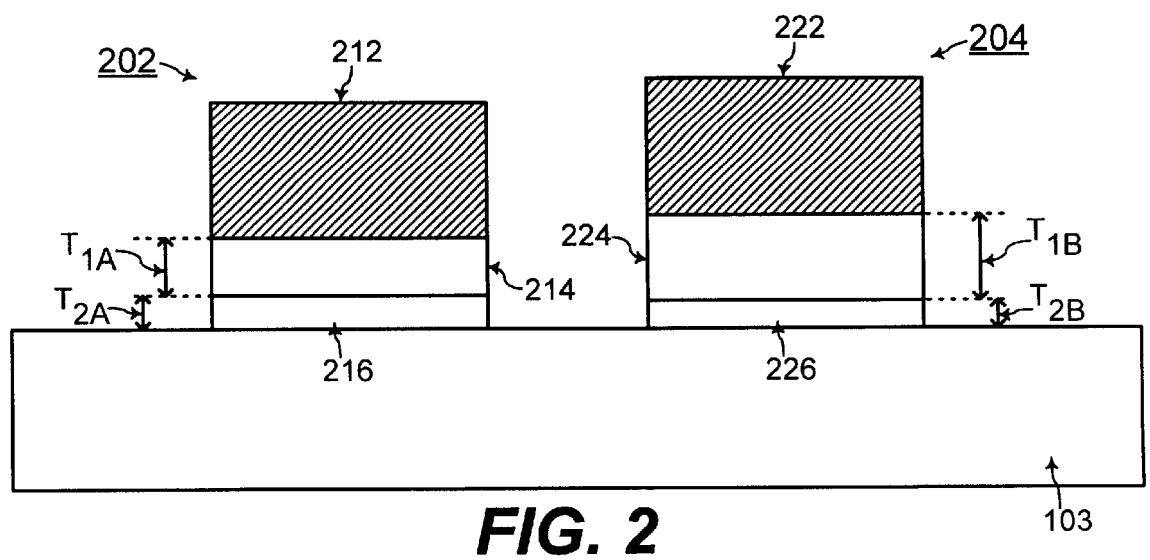
FIG. 2 shows a cross-sectional view of two test MOS (metal oxide semiconductor) stacks each having a respective interfacial structure and a respective high-K structure, according to an embodiment of the present invention.
Figure 5:
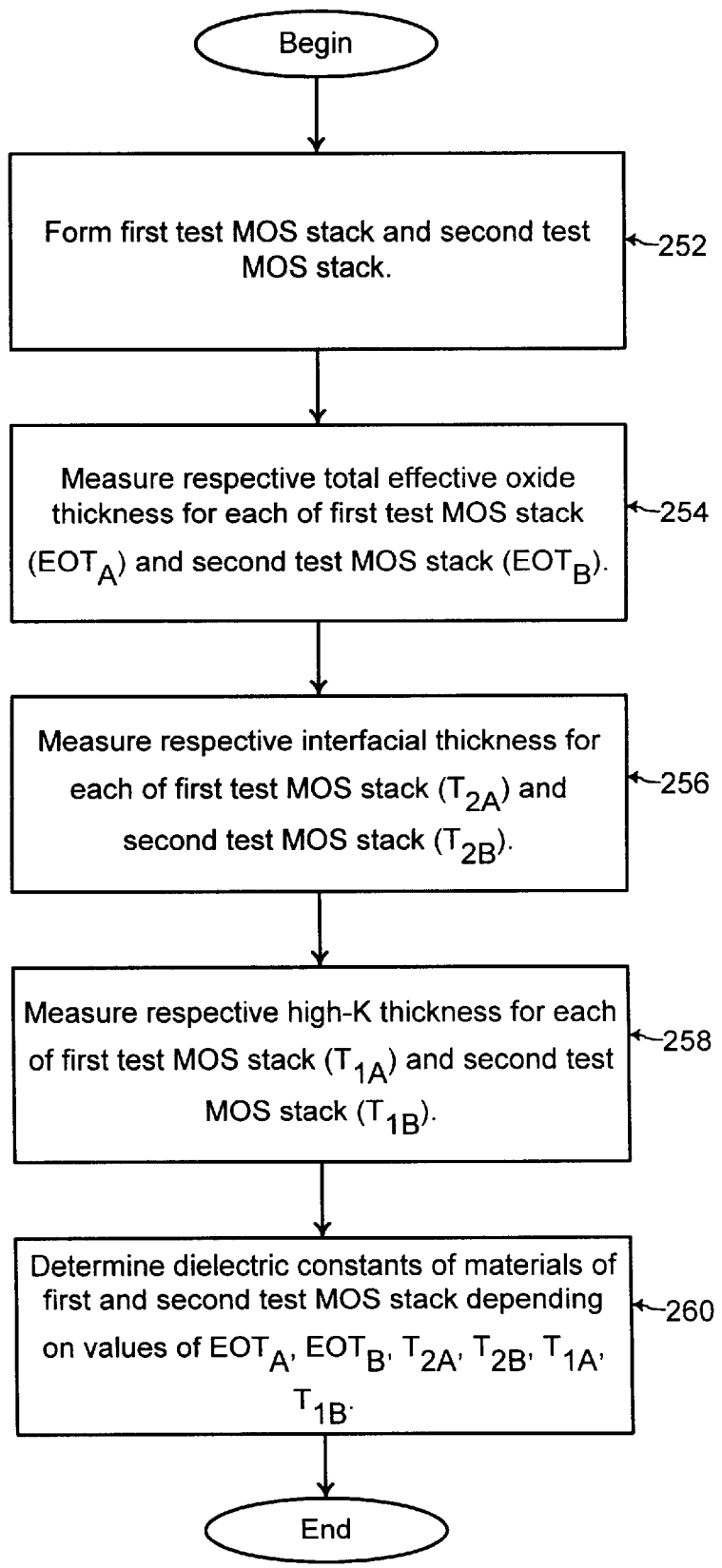
FIG. 5 shows a flowchart of steps for determining a first dielectric constant, $e_1$, for a first dielectric material and a second dielectric constant, $e_2$, for a second dielectric material forming the first and second test MOS stacks of FIG. 2, according to an embodiment of the present invention.

FIG. 5 shows the steps of performing the present invention according to one embodiment of the present invention. Referring to FIGS. 2 and 5, for determining the dielectric constant of the dielectric materials within a MOS (metal oxide semiconductor) stack, a first test MOS stack 202 and a second test MOS stack 204 are formed on the semiconductor substrate 103 (step 252 in FIG. 5). The first test MOS stack 202 includes a first conductive structure 212 comprised of a metal (or other types of conductive material such as polysilicon for example) formed on a first high-K structure 214. The first high-K structure 214 has a first high-K thickness $T_{1A}$ and is comprised of a first dielectric material having a high-K dielectric constant $e_1$ (i.e., higher than the dielectric constant of silicon dioxide ($SiO_2$)).

In addition, a first interfacial structure 216 is disposed between the first high-K structure 214 and the semiconductor substrate 103 to provide a smooth structural transition from the first high-K structure 214 to the semiconductor substrate 103. The first interfacial structure 216 has a first interfacial thickness $T_{2A}$ and is comprised of a second dielectric material having an interfacial dielectric constant $e_2$. The first dielectric material forming the first high-K structure 214 has the high-K dielectric constant $e_1$ that is typically higher than the interfacial dielectric constant $e_2$ of the second dielectric material forming the first interfacial structure 216.

Similarly, the second test MOS stack 204 includes a second conductive structure 222 comprised of a metal (or other types of conductive material such as polysilicon for example) formed on a second high-K structure 224. The second high-K structure 224 has a second high-K thickness $T_{1B}$ and is comprised of the first dielectric material having the high-K dielectric constant $e_1$ (i.e., higher than the dielectric constant of silicon dioxide ($SiO_2$)). In addition, a second interfacial structure 226 is disposed between the second high-K structure 224 and the semiconductor substrate 103 to provide a smooth structural transition from the second high-K structure 224 to the semiconductor substrate 103. The second interfacial structure 226 has a second interfacial thickness $T_{2B}$ and is comprised of the second dielectric material having the interfacial dielectric constant $e_2$. The first dielectric material forming the second high-K structure 224 has the high-K dielectric constant $e_1$ that is typically higher than the interfacial dielectric constant $e_2$ of the second dielectric material forming the second interfacial structure 226.

For example, in one embodiment of the present invention, the semiconductor substrate 103 is comprised of silicon, the first and second interfacial structure 216 and 226 are comprised of silicon dioxide ($SiO_2$), the first and second high-K structures 214 and 224 are comprised of a metal oxide, and the first and second conductive structures 212 and 222 are comprised of aluminum or polysilicon. Processes for forming such first and second test MOS stacks 202 and 204 are known to one of ordinary skill in the art of integrated circuit fabrication.

Figure 3:
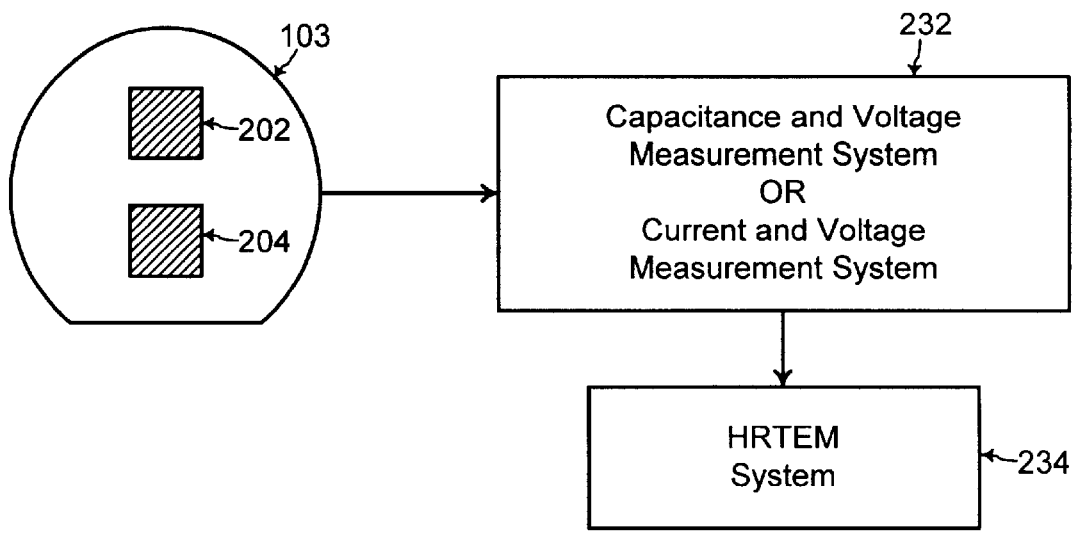
FIG. 3 shows a system block diagram including systems for measuring the thickness parameters of the first and second test MOS stacks of FIG. 2 when the first and second test MOS stacks are disposed on a same semiconductor substrate, according to an embodiment of the present invention.

Referring to FIG. 3, the effective oxide thickness of a MOS stack including a high-K structure and an interfacial structure, EOT, is measurable with a capacitance and voltage measurement system or a current and voltage measurement system 232, as known to one of ordinary skill in the art of integrated circuit fabrication. Capacitance and voltage measurement systems or current and voltage measurement systems for measuring the effective oxide thickness, EOT, of a MOS stack such as the first and second test MOS stacks 202 and 204 are commercially available and are known to one of ordinary skill in the art of integrated circuit fabrication.

In addition, the physical thicknesses $T_{1A}$, $T_{2A}$, $T_{1B}$, and $T_{2B}$ for the first high-K structure 214, the first interfacial structure 216, the second high-K structure 224, and the second interfacial structure 226, respectively, are measurable using a HRTEM (high resolution transmission electron microscopy) system 234, as known to one of ordinary skill in the art of integrated circuit fabrication. HRTEM systems for measuring the physical thicknesses of layers of dielectric material in a MOS stack such as the physical thicknesses $T_{1A}$, $T_{2A}$, $T_{1B}$, and $T_{2B}$ for the first high-K structure 214, the first interfacial structure 216, the second high-K structure 224, and the second interfacial structure 226, respectively, of the first and second test MOS stacks 202 and 204 are commercially available and are known to one of ordinary skill in the art of integrated circuit fabrication.

Referring to FIG. 3, the semiconductor substrate 103 having the first and second test MOS stacks 202 and 204 is placed in the capacitance and voltage measurement system or current and voltage measurement system 232 to measure the effective oxide thickness, $EOT_A$, of the first test MOS stack 202 and to measure the effective oxide thickness, $EOT_B$, of the second test MOS stack 204 (step 254 of FIG. 5). Techniques for measuring the effective oxide thicknesses, $EOT_A$ and $EOT_B$ of the first and second test MOS stacks 202 and 204 within the capacitance and voltage measurement system or current and voltage measurement system 232 that are commercially available are known to one of ordinary skill in the art of integrated circuit fabrication.

Further referring to FIG. 3, the semiconductor substrate 103 having the first and second test MOS stacks 202 and 204 is also placed in the HRTEM system 234 to measure the physical thicknesses $T_{1A}$ and $T_{2A}$ for the first high-K structure 214 and the first interfacial structure 216 of the first test MOS stack 202 (steps 256 and 258 of FIG. 5). In addition, the HRTEM system 234 is used to measure the physical thicknesses $T_{1B}$ and $T_{2B}$ of the second high-K structure 224 and the second interfacial structure 226 of the second test MOS stack 204 (steps 256 and 258 of FIG. 5). Techniques for measuring such physical thicknesses $T_{1A}$, $T_{2A}$, $T_{1B}$, and $T_{2B}$ of the dielectric materials forming the first and second test MOS stacks 202 and 204 within the HRTEM system 234 that is commercially available are known to one of ordinary skill in the art of integrated circuit fabrication.

Figure 4:
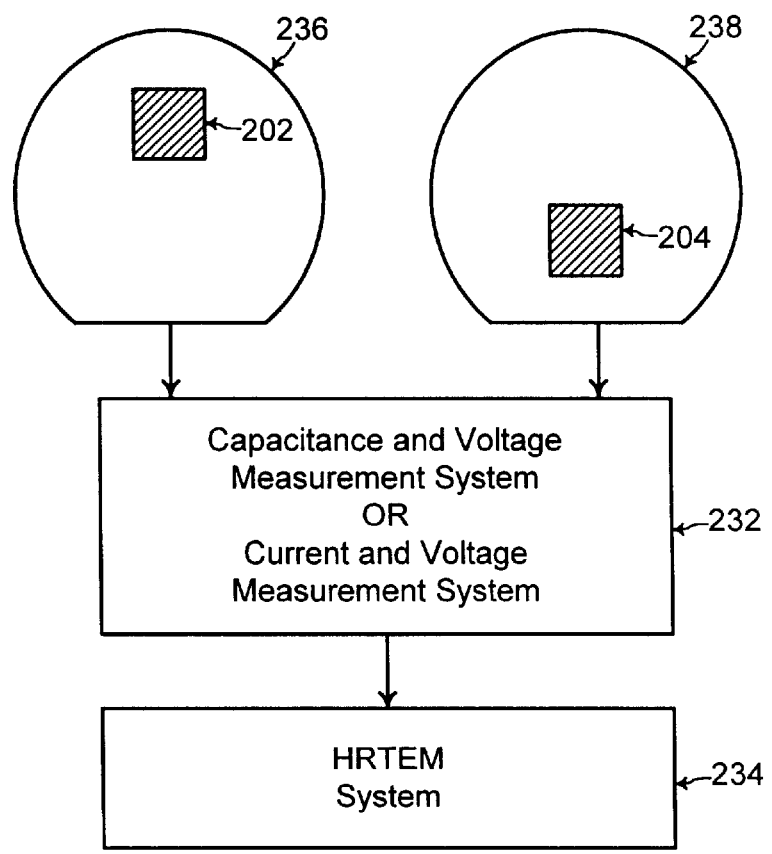
FIG. 4 shows a system block diagram including systems for measuring the thickness parameters of the first and second test MOS stacks of FIG. 2 when the first and second test MOS stacks are disposed on different semiconductor substrates, according to an embodiment of the present invention.

In FIG. 3, the first and second test MOS stacks 202 and 204 are formed on a same semiconductor substrate 103 according to one embodiment of the present invention. Referring to FIG. 4, in another embodiment of the present invention, the first test MOS stack 202 is formed on a first semiconductor substrate 236, and the second test MOS stack 204 is formed on a second semiconductor substrate 238 that is different from the first semiconductor substrate 236. In that case, both the first and second semiconductor substrates 236 and 238 are placed in the capacitance and voltage measurement system or current and voltage measurement system 232 to measure the effective oxide thickness, $EOT_A$, of the first test MOS stack 202 and to measure the effective oxide thickness, $EOT_B$, of the second test MOS stack 204. In addition, both the first and second semiconductor substrates 236 and 238 are placed in the HRTEM system 234 to measure the physical thicknesses $T_{1A}$, $T_{2A}$, $T_{1B}$, and $T_{2B}$ of the dielectric materials forming the first and second test MOS stacks 202 and 204.

With measurement of the values for $EOT_A$, $EOT_B$, $T_{1A}$, $T_{2A}$, $T_{1B}$, and $T_{2B}$, the first dielectric constant, $e_1$, and the second dielectric constant, $e_2$, are determined depending on relations between values of $EOT_A$, $T_{1A}$, and $T_{2A}$, and between values of $EOT_B$, $T_{1B}$, and $T_{2B}$ (step 260 of FIG. 5). For example, the effective oxide thickness for the first and second test MOS stacks 202 and 204 may be expressed as follows:

$$EOT_A = T_{1A}*(e_{ox}/e_1) + T_{2A}*(e_{ox}/e_2)$$

$$EOT_B = T_{1B}*(e_{ox}/e_1) + T_{2B}*(e_{ox}/e_2)$$

$EOT_A$ is the effective oxide thickness of the first test MOS stack 202 including the first high-K structure 214 and the first interfacial structure 216 and is measured using the capacitance and voltage measurement system or current and voltage measurement system 232. $EOT_B$ is the effective oxide thickness of the second test MOS stack 204 including the second high-K structure 224 and the second interfacial structure 226 and is measured using the capacitance and voltage measurement system or current and voltage measurement system 232. $e_{ox}$, is the dielectric constant of silicon dioxide ($SiO_2$) in bulk and is known to one of ordinary skill in the art of integrated circuit fabrication. The physical thicknesses $T_{1A}$, $T_{2A}$, $T_{1B}$, and $T_{2B}$ for the first high-K structure 214, the first interfacial structure 216, the second high-K structure 224, and the second interfacial structure 226, respectively, are measured using the HRTEM system 234.

With the values for $EOT_A$, $EOT_B$, $T_{1A}$, $T_{2A}$, $T_{1B}$, and $T_{2B}$ measured and known, only the two variables $e_1$ (which is the dielectric constant of the first dielectric material forming the first and second high-K structures 214 and 224) and $e_2$ (which is the dielectric constant of the second dielectric material forming the first and second interfacial structures 216 and 226) are un-known. However, the values for the two variables $e_1$ and $e_2$ may be solved from the two equations above.

In this manner, the interfacial structures 216 and 226 and the high-K structures 214 and 224 of the first and second test MOS stacks 202 and 204 are formed to be comprised of the first and second dielectric materials. The first dielectric constant, $e_1$, for the first dielectric material and the second dielectric constant, $e_2$, for the second dielectric material are determined from measuring the thickness parameters $EOT_A$, $EOT_B$, $T_{1A}$, $T_{2A}$, $T_{1B}$, and $T_{2B}$ of the first and second test MOS stacks 202 and 204. Thus, the first dielectric constant, $e_1$, for the first dielectric material and the second dielectric constant, $e_2$, for the second dielectric material are effectively determined even when the interfacial structure and the high-K structure of a MOS stack are formed to be relatively thin in the range of tens of angstroms.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "on" and "between" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for determining a first dielectric constant, $e_1$, for a first dielectric material and a second dielectric constant, $e_2$, for a second dielectric material forming a MOS (metal oxide semiconductor) stack, the method including the steps of:

A. forming a first test MOS (metal oxide semiconductor) stack having a first total effective oxide thickness, $EOT_A$, and being comprised of:

a first interfacial structure comprised of said second dielectric material having said second dielectric constant, $e_2$, and having a first interfacial thickness $T_{2A}$, wherein said first interfacial structure is disposed on a semiconductor substrate; and a first high-K structure comprised of said first dielectric material having said first dielectric constant, $e_1$, and having a first high-K thickness, $T_{1A}$, wherein said first high-K structure is disposed between said first interfacial structure and a first conductive structure;

B. forming a second test MOS (metal oxide semiconductor) stack having a second total effective oxide thickness, $EOT_B$, and being comprised of:

a second interfacial structure comprised of said second dielectric material having said second dielectric constant, $e_2$, and having a second interfacial thickness $T_{2B}$, wherein said second interfacial structure is disposed on said semiconductor substrate; and a second high-K structure comprised of said first dielectric material having said first dielectric constant, $e_1$, and having a second high-K thickness $T_{1B}$, wherein said second high-K structure is disposed between said second interfacial structure and a second conductive structure;

C. measuring said first total effective oxide thickness, $EOT_A$, of said first test MOS stack and measuring said second total effective oxide thickness, $EOT_B$, of said second test MOS stack;

D. measuring said first interfacial thickness, $T_{2A}$, of said first interfacial structure and measuring said first high-K thickness, $T_{1A}$, of said first high-K structure;

E. measuring said second interfacial thickness, $T_{2B}$, of said second interfacial structure and measuring said second high-K thickness, $T_{1B}$, of said second high-K structure; and F. determining said first dielectric constant, $e_1$, and said second dielectric constant, $e_2$, depending on relations between values of $EOT_A$, $T_{1A}$, and $T_{2A}$, and between values of $EOT_B$, $T_{1B}$, and $T_{2B}$.

2. The method of claim 1, wherein said relations between values of $EOT_A$, $T_{1A}$, and $T_{2A}$ and between values of $EOT_B$, $T_{1B}$, and $T_{2B}$ are as follows:

$$EOT_A = T_{1A}*(e_{ox}/e_1) + T_{2A}*(e_{ox}/e_2)$$

$$EOT_B = T_{1B}*(e_{ox}/e_1) + T_{2B}*(e_{ox}/e_2),$$

wherein $e_{ox}$, is the dielectric constant of silicon dioxide ($SiO_2$).

3. The method of claim 1, wherein said first conductive structure of said first test MOS stack and said second conductive structure of said second test MOS stack are comprised of a metal.

4. The method of claim 1, wherein said first conductive structure of said first test MOS stack and said second conductive structure of said second test MOS stack are comprised of polysilicon.

5. The method of claim 1, wherein said first total effective oxide thickness, $EOT_A$, of said first test MOS stack and said second total effective oxide thickness, $EOT_B$, of said second test MOS stack are measured in said step C using a capacitance and voltage measurement system.

6. The method of claim 1, wherein said first total effective oxide thickness, $EOT_A$, of said first test MOS stack and said second total effective oxide thickness, $EOT_B$, of said second test MOS stack are measured in said step C using a current and voltage measurement system.

7. The method of claim 1, wherein said first interfacial thickness, $T_{2A}$, of said first interfacial structure and said first high-K thickness, $T_{1A}$, of said first high-K structure are measured in said step D using a HRTEM (high resolution transmission electron microscopy) system.

8. The method of claim 1, wherein said second interfacial thickness, $T_{2B}$, of said second interfacial structure and said second high-K thickness, $T_{1B}$, of said second high-K structure are measured in said step E using a HRTEM (high resolution transmission electron microscopy) system.

9. The method of claim 1, wherein said first test MOS stack and said second test MOS stack are disposed on a same semiconductor substrate.

10. The method of claim 1, wherein said first test MOS stack and said second test MOS stack are disposed on different semiconductor substrates.

11. The method of claim 1, wherein said semiconductor substrate is comprised of silicon, and wherein said first interfacial structure and said second interfacial structure are comprised of silicon dioxide ($SiO_2$).

12. The method of claim 11, wherein said first high-K structure and said second high-K structure are comprised of a dielectric material having said first dielectric constant, $e_1$, that is higher than the dielectric constant of silicon dioxide ($SiO_2$) such that said first high-K thickness, $T_{1A}$, and said second high-K thickness, $T_{1B}$, are greater than said first interfacial thickness, $T_{2A}$, and said second interfacial thickness, $T_{2B}$.

13. A system for determining a first dielectric constant, $e_1$, for a first dielectric material and a second dielectric constant, $e_2$, for a second dielectric material forming a MOS (metal oxide semiconductor) stack, the system comprising:

a first test MOS (metal oxide semiconductor) stack having a first total effective oxide thickness, $EOT_A$, and being comprised of:

a first interfacial structure comprised of said second dielectric material having said second dielectric constant, $e_2$, and having a first interfacial thickness $T_{2A}$, wherein said first interfacial structure is disposed on a semiconductor substrate; and a first high-K structure comprised of said first dielectric material having said first dielectric constant, $e_1$, and having a first high-K thickness, $T_{1A}$, wherein said first high-K structure is disposed between said first interfacial structure and a first conductive structure;

a second test MOS (metal oxide semiconductor) stack having a second total effective oxide thickness, $EOT_B$, and being comprised of:

a second interfacial structure comprised of said second dielectric material having said second dielectric constant, $e_2$, and having a second interfacial thickness $T_{2B}$, wherein said second interfacial structure is disposed on said semiconductor substrate; and a second high-K structure comprised of said first dielectric material having said first dielectric constant, $e_1$, and having a second high-K thickness $T_{1B}$, wherein said second high-K structure is disposed between said second interfacial structure and a second conductive structure;

means for measuring said first total effective oxide thickness, $EOT_A$, of said first test MOS stack and measuring said second total effective oxide thickness, $EOT_B$, of said second test MOS stack;

means for measuring said first interfacial thickness, $T_{2A}$, of said first interfacial structure and measuring said first high-K thickness, $T_{1A}$, of said first high-K structure; and means for measuring said second interfacial thickness, $T_{2B}$, of said second interfacial structure and measuring said second high-K thickness, $T_{1B}$, of said second high-K structure;

wherein said first dielectric constant, $e_1$, and said second dielectric constant, $e_2$, are determined from relations between values of $EOT_A$, $T_{1A}$, and $T_{2A}$, and between values of $EOT_B$, $T_{1B}$, and $T_{2B}$.

14. The system of claim 13, wherein said relations between values of $EOT_A$, $T_{1A}$, and $T_{2A}$, and between values of $EOT_B$, $T_{1B}$, and $T_{2B}$ are as follows:

$$EOT_A = T_{1A} * (e_{ox}/e_1) + T_{2A} * (e_{ox}/e_2)$$

$$EOT_B = T_{1B} * (e_{ox}/e_1) + T_{2B} * (e_{ox}/e_2),$$

wherein $e_{ox}$ is the dielectric constant of silicon dioxide ($SiO_2$).

15. The system of claim 13, wherein said first conductive structure of said first test MOS stack and said second conductive structure of said second test MOS stack are comprised of a metal.

16. The system of claim 13, wherein said first conductive structure of said first test MOS stack and said second conductive structure of said second test MOS stack are comprised of polysilicon.

17. The system of claim 13, wherein said means for measuring said first total effective oxide thickness, $EOT_A$, of said first test MOS stack and said second total effective oxide thickness, $EOT_B$, of said second test MOS stack include a capacitance and voltage measurement system.

18. The system of claim 13, wherein said means for measuring said first total effective oxide thickness, $EOT_A$, of said first test MOS stack and said second total effective oxide thickness, $EOT_B$, of said second test MOS stack include a current and voltage measurement system.

19. The system of claim 13, wherein said means for measuring said first interfacial thickness, $T_{2A}$, of said first interfacial structure and said first high-K thickness, $T_{1A}$, of said first high-K structure include a HRTEM (high resolution transmission electron microscopy) system.

20. The system of claim 13, wherein said means for measuring said second interfacial thickness, $T_{2B}$, of said second interfacial structure and said second high-K thickness, $T_{1B}$, of said second high-K structure include a HRTEM (high resolution transmission electron microscopy) system.

21. The system of claim 13, wherein said first test MOS stack and said second test MOS stack are disposed on a same semiconductor substrate.

22. The system of claim 13, wherein said first test MOS stack and said second test MOS stack are disposed on different semiconductor substrates.

23. The system of claim 13, wherein said semiconductor substrate is comprised of silicon, and wherein said first interfacial structure and said second interfacial structure are comprised of silicon dioxide ($SiO_2$).

24. The system of claim 23, wherein said first high-K structure and said second high-K structure are comprised of a dielectric material having said first dielectric constant, $e_1$, that is higher than the dielectric constant of silicon dioxide ($SiO_2$) such that said first high-K thickness, $T_{1A}$, and said second high-K thickness, $T_{1B}$, are greater than said first interfacial thickness, $T_{2A}$, and said second interfacial thickness, $T_{2B}$.

* * * * *